United States Patent
Sung et al.

[11] Patent Number: 6,124,178
[45] Date of Patent: Sep. 26, 2000

[54] METHOD OF MANUFACTURING MOSFET DEVICES

[75] Inventors: Kuan-Chou Sung, Taoyuan; Chien Chou, Chiayi Hsien; Steve Hsu, Hsinchu Hsien; Elmer Chen, Taipei, all of Taiwan

[73] Assignee: Mosel Vitelic, Inc., Hsinchu, Taiwan

[21] Appl. No.: 09/383,374

[22] Filed: Aug. 26, 1999

[51] Int. Cl.⁷ .................................................. H01L 21/336
[52] U.S. Cl. ........................ 438/308; 438/197; 438/760; 438/783; 438/786; 438/952
[58] Field of Search .................................. 438/197, 308, 438/760, 783, 786, 952

[56] References Cited

U.S. PATENT DOCUMENTS

| | | | |
|---|---|---|---|
| 5,441,914 | 8/1995 | Taft et al. | 438/592 |
| 5,869,388 | 2/1999 | Chan et al. | 438/760 |
| 6,025,279 | 2/2000 | Chiang et al. | 438/760 |

*Primary Examiner*—Trung Dang
*Attorney, Agent, or Firm*—Irah H. Donner; Hale and Dorr LLP

[57] ABSTRACT

A method for forming a MOSFET device on a semiconductor substrate is disclosed here. First, a gate oxide layer, a polysilicon layer, a metal silicide layer and a silicon oxynitride layer are formed on the semiconductor substrate in sequence. Then, the silicon oxynitride layer, the metal silicide layer, the polysilicon layer and the gate oxide layer are etched to define a gate pattern. The sidewall spacers are formed on the sidewalls of the gate structure. The source and drain areas are defined by forming the doping areas in the semiconductor substrate. Next, a non-doped dielectric layer is formed above the semiconductor substrate to cover the gate structure, the sidewall spacers and the source/drain areas. An annealing procedure is next performed about 10 to 15 minutes at a temperature of about 800 to 850° C. Then, a dielectric layer is formed on said non-doped dielectric layer.

15 Claims, 2 Drawing Sheets

METHOD OF MANUFACTURING MOSFET DEVICES

FIELD OF THE INVENTION

The present invention relates to a process for manufacturing a semiconductor device, and more specifically, to a process for manufacturing a MOSFET (Metal Oxide Semiconductor Field Effect Transistor) device with a silicide gate.

BACKGROUND OF THE INVENTION

With the continuous advancement and development in the semiconductor manufacture, the MOSFET devices are widely used in various integration circuits. The typical MOSFET device comprises of the gate structure formed on the substrate and the source and drain structures manufactured by forming the doping areas adjacent to the gate structure with the opposite dopant relative to the substrate. However, the performance of the manufactured device can not be promoted due to the sizes of the MOSFET devices are decreasing with the increasing package integration.

In general, the MOSFET device usually comprises a metal layer, a silicon oxide layer and a semiconductor substrate, wherein the metal layer is used to serve as the gate structure. Though, the polysilicon material is always used to substitute for the metal layer cause the adhesion of the polysilicon layer is better than the metal layer for the silicon oxide layer. It is not suitable to use only the polysilicon layer for serving as the gate structure due to the lower electrical conductivity of the polysilicon material into which even the dopant are implanted. Actually, in the present process, a metal silicide layer is formed on the polysilicon layer to promote the conductivity of the whole gate structure.

The typical manufacturing process and structure of the MOSFET are as illustrated in FIG. 1. At first a gate structure 20 is defined on a semiconductor substrate 10, wherein the gate structure 20 is a multi-layers structure which comprises the gate oxide layer 20a formed on the substrate 10, the polysilicon layer 20b formed on the gate oxide layer 20a, the metal silicide layer 20c formed on the polysilicon layer 20b, and the ARC (anti-reflected) layer 20d formed on the metal silicide layer 20c. Besides, the sidewall spacers 22 are formed on the sidewalls of the gate structure 20. Then, the source and drain areas are defined by forming the doping areas 24 in the semiconductor substrate 10 adjacent to the gate structure 20.

In general, after the MOSFET device structure is formed, the non-doped silicate glass (NSG) 26 is coated onto the substrate 10 to cover the MOSFET device. The NSG layer 26 is used to prevent the electrical conductivity of the MOSFET device from varying due to the dopant of the BPSG (Borophosphosilicate Glass) layer formed in the next step can diffuse into the MOSFET device. Then, the BPSG layer 28 is formed on the substrate 10 to cover the NSG layer 26 for serving as the inter-metal layer (IMD). After forming the BPSG layer 28, a thermal flow procedure is performed about 30 to 120 minutes at a temperature of about 850 to 950° C. to promote the planarization of the BPSG layer 28.

However, after performing the thermal flow procedure, peeling and delamination usually occur between the interface of the NSG layer 26 and the oxynitride layer 20d because the adhesions among the NSG layer 26, the oxynitride layer 20d and the metal silicide layer 20c are worse. Thus, the performance and yields of the manufactured devices are both decreased.

SUMMARY OF THE INVENTION

The prime objective of the present invention is to provide a method for decreasing the addition structure stress in the manufactured MOSFET device.

The another objective of the present invention is to reduce the addition stress between the oxynitride layer and the NSG layer in manufacturing the MOSFET device.

The further objective of the present invention is to promote the adhesion among the oxynitride layer, the NSG layer and metal silicide layer by performing an annealing procedure after forming the NSG layer.

A method of forming a MOSFET device on a semiconductor substrate is disclosed in the present invention. First, a gate oxide layer is formed on the semiconductor substrate, a polysilicon layer is formed on the gate oxide layer, a metal silicide layer is formed on the polysilicon layer, and a silicon oxynitride layer is formed on the metal silicide layer to serve as an anti-reflection (ARC) layer. Then, an etching step is performed to etch the silicon oxynitride layer, the metal silicide layer, the polysilicon layer, and the gate oxide layer to expose a portion of the semiconductor substrate for defining a gate structure on the semiconductor substrate. The sidewall spacers are next formed on the sidewalls of the gate structure. Then, the doping areas are formed in the semiconductor substrate adjacent to the gate structure for serving as the source/drain areas. A non-doped silicate glass layer is formed on the semiconductor substrate to cover the gate structure, the sidewall spacers, and the doping areas. An annealing procedure is done about 10 to 15 minutes at a temperature of about 800 to 850° C. A BPSG layer is then formed on the non-doped silicate glass.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

The present invention proposes a novel method for forming the MOSFET device. By performing the annealing procedure after forming the non-doped dielectric layer, the additional stress between the oxynitride layer and the non-doped dielectric layer is reduced. And the adhesions of the interfaces among the non-doped dielectric layer, oxynitride layer, and metal silicide layer are promoted, for prevent effectively from the above peeling and delamination issues. Besides, the annealing procedure can be used to replace the annealing step after forming the metal silicide layer and also to replace the annealing step for activating and diffusing the dopant in the semiconductor substrate to form the source/drain areas. The detailed description of the present invention is as follows.

Figure 1:
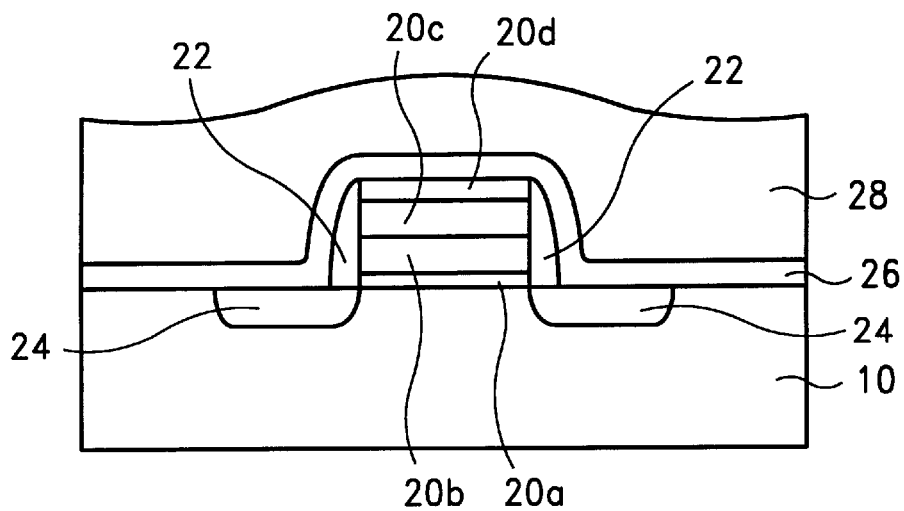
FIG. 1 is a cross-sectional view of a semiconductor wafer illustrating the structures of a manufactured MOSFET device formed according to the prior art.
Figure 2:
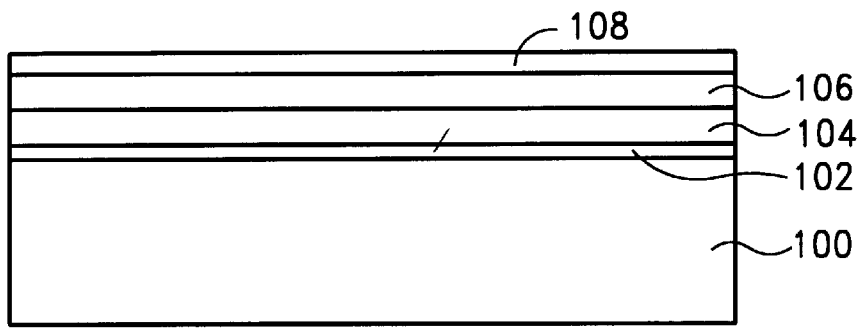
FIG. 2 is a cross-sectional view of a semiconductor wafer illustrating the step of forming a gate oxide layer, polysilicon layer, metal silicide layer, and ARC layer according to the present invention.

Please refer to FIG. 2, in the preferred embodiment, a silicon substrate 100 is provided with <100> crystallographic orientation. In general, various semiconducting materials, such as gallium arsenide, germanium or silicon on insulator (SOI) can be chosen to serve as the substrate 100. Besides, any other suitable orientation such as <110> or <111> is useful due to the surface property is not critical in the present invention.

Then, a gate oxide layer 102 is formed on the substrate 100. In a preferred embodiment, the gate oxide layer 102 is formed on the substrate 102 by using an oxygen-steam ambient, at a temperature between about 800 to 1100 degrees centigrade. Alternatively, the gate oxide layer 102 may be formed using other known oxide chemical compositions and procedures. For example, the gate oxide layer 102 can be formed by using chemical vapor deposition (CVD) process, using TEOS as a source at a temperature between about 600 to 800° C., at a pressure 0.1 to 10 torrs. The thickness of the gate oxide layer 102 is preferably about 15–200 angstroms.

Next, a polysilicon layer 104 is formed on the gate oxide layer 102. In a preferred embodiment, the silane (SiH4) source is dissolved by thermal treatment for depositing the required polysilicon layer 104 by using the lower pressure chemically vapor deposition at a temperature of about 600 to 650° C. and a pressure of about 0.3 to 0.6 torrs. Besides, the in-situ doping procedure during the step of forming polysilicon layer 104 or the implanting step after forming the polysilicon layer 104 can be chosen to reduce the electrical resistance of the polysilicon layer 104.

After the polysilicon layer 104 is formed, a metal silicide layer 106 is formed on the polysilicon layer 104. In general, the metal silicide layer 106 is formed by using the reactive source, such as tungsten hexafluoride and silane, at a temperature of about 300 to 400° C. and a pressure of about 0.3 to 1.0 torrs. Besides, other metal silicide compound, such as $TiSi_2$, $MOSi_2$, $TaSi_2$, $CoSi_2$ can be used to form the metal silicide layer 106.

Then, a silicon oxynitride layer 108 is formed on the metal silicide layer 106 to serve as an anti-reflection (ARC) layer. In a preferred embodiment, the silicon oxynitride layer 108 is deposited at a temperature of about 450° C. by using the plasma enhanced chemically vapor depositing process, and the reactive gases comprise of $SiH_4$, $N_2O$ and $N_2$.

Figure 3:
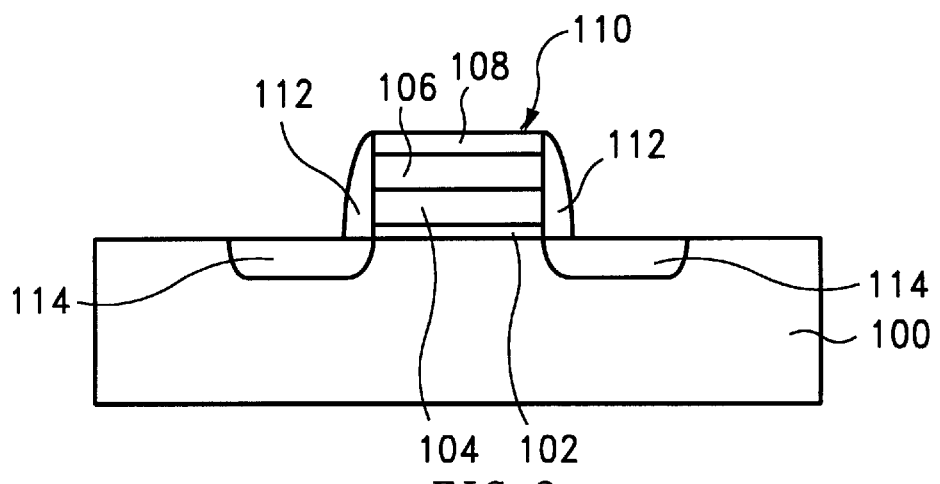
FIG. 3 is a cross-sectional view of a semiconductor wafer illustrating the step of defining the gate pattern and forming the source/drain areas on the semiconductor substrate according to the present invention.

Refer to FIG. 3, an etching step is then performed to etch the silicon oxynitride layer 108, the metal silicide layer 106, the polysilicon layer 104 and the gate oxide layer 102 to expose a portion of the semiconductor substrate 100 for defining a gate structure 110 on the semiconductor substrate 100. In a preferred embodiment, the photoresist with the gate structure pattern is formed on the silicon oxynitride layer 108 firstly. Then, the above etching step is done by using the photoresist as an etching mask until the semiconductor substrate 100 is reached. Thus, after removing the photoresist, the gate structure 110 as shown in FIG. 3 is shown.

After defining the gate structure 110, the sidewall spacers 112 are next formed on the sidewalls of the gate structure 110. Namely, the sidewall spacers 112 are formed on the sidewalls of the silicon oxynitride layer 108, the metal silicide layer 106, the polysilicon layer 104 and the gate oxide layer 102. Typically, a silicon nitride layer is first formed on the substrate 100 to cover the whole gate structure 110 by using the chemically vapor depositing (CVD) process. Then, an anisotropically etching procedure is performed to etch the silicon nitride layer to form the sidewall spacers 112 on the sidewalls of the gate structure 110. The etchant used to etch the silicon nitride layer can be chosen from the group of $CCl_2F_2$, $CHF_3/CF_4$, $CHF_3/O_2$, $CH_3CHF_2$, $CF_4/O_2$. In addition, other dielectric materials can be used to form the sidewall spacers 112.

Figure 4:
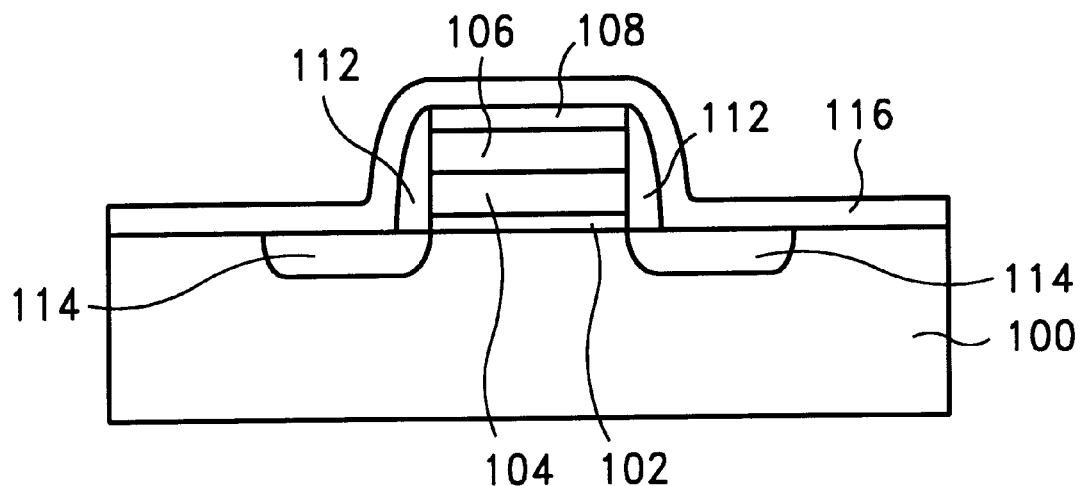
FIG. 4 is a cross-sectional view of a semiconductor wafer illustrating the step of forming NSG layer on the semiconductor substrate according to the present invention.

Then, referring to FIG. 4, the doping areas 114 are formed in the substrate 100 and adjacent to the gate structure 110 for serving as the source/drain areas 114. In general, an implanting procedure is done to implant dopant into the substrate 100 for forming the source/drain areas 114 by using the gate structure 110, the sidewall spacers 112 and the filed oxide separation (FOX) (not shown in FIGURE) for serving as masks.

Still referring to FIG. 4, a non-doped dielectric layer 116 is formed on the substrate 100 to cover the gate structure 110, the sidewall spacers 112, and the doping areas 114. In a preferred embodiment, the non-doped silicate glass (NSG) layer with a thickness of about 1000 to 2500 angstroms is formed to serve as the non-doped dielectric layer 116. As described above, the non-doped dielectric layer 116 is used to prevent the dopant of the BPSG layer deposited in later steps from diffusing into the manufactured MOSFET devices, and cause the electrical conductivity change.

It is noted that an annealing procedure is done immediately after forming the non-doped dielectric layer 116. The annealing procedure is performed about 10 to 15 minutes at a temperature of about 800 to 850° C., wherein the nitrogen gas is input into the chamber with a flow rate about 5000 to 7000 sccm. The annealing procedure is used to reduce the additional structure stress between the non-doped dielectric layer 116 (such as NSG) and the silicon oxynitride layer 108 (the upper layer of the gate structure 110), and to promote the adhesion among the interfaces of the non-doped dielectric layer/silicon oxynitride layer/metal silicide layer for preventing the above peeling and delamination occurring. Besides, the annealing procedure can be used to replace the required annealing step after forming the metal silicide layer 106, and to replace the thermal flowing step after performing the implanting step to form the source/drain areas. Namely, the annealing procedure after forming the non-doped dielectric layer 116 can reduce and release the additional structure stress effectively, and can repair the damage portions and activate the dopant of the source/drain areas 114 after performing the implanting step.

Figure 5:
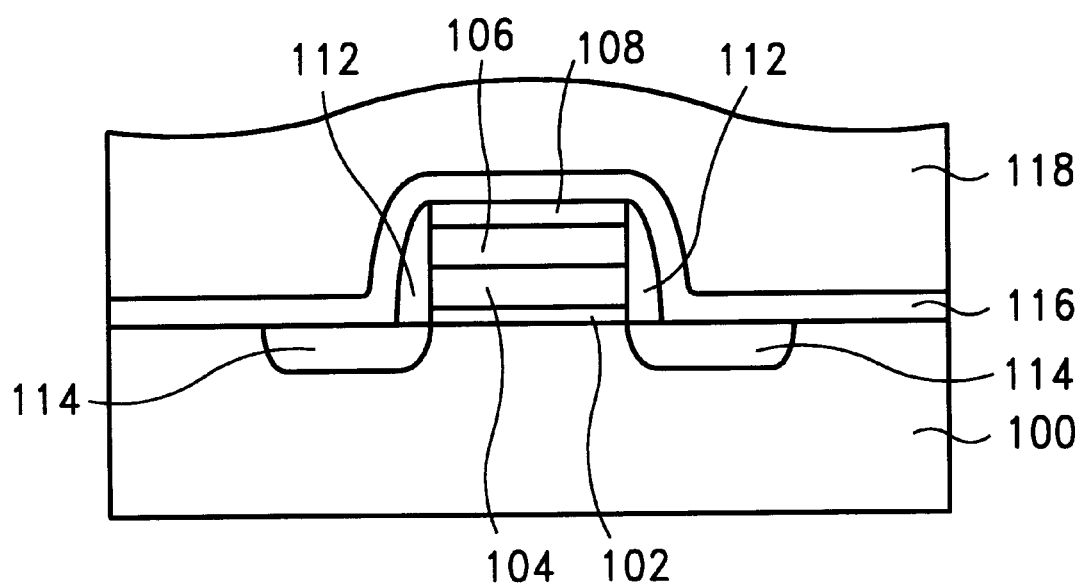
FIG. 5 is a cross-sectional view of a semiconductor wafer illustrating the step of forming the BPSG layer on the semiconductor substrate according to the present invention.

Then, referring to FIG. 5, a borophosphosilicate glass (BPSG) layer 118 is formed on the non-doped dielectric layer 116 to serve as the inter-metal dielectric layer. In a preferred embodiment, the BPSG layer 118 with a thickness of about 4000 to 11000 angstroms is formed by the process of LPCVD(Low Pressure CVD), APCVD(Air Pressure CVD) process or PECVD(Plasma Enhanced CVD) process at a temperature of about 300° C. to 600° C. and a pressure of about 1 to 10 torrs. In the step to form the BPSG layer 118, the reactive gases can be chosen from the group of $SiH_4$, $PH_3$, $B_2H_6$, TEOS, $O_3$, TEB(Tri-Ethyl-Borate), TMPO(Tri-Methyl-Phosphate), etc. Then, a high temperature thermal anneal is performed at a temperature of about 850 to 950° C. to reflow the BPSG layer 118 about 30 to 120 minutes for smoothing the surface of the BPSG layer 118 and increasing the planarization of the BPSG layer 118.

As can be appreciated from the above disclosure, the present invention provides the following advantages. First, by performing the annealing procedure after forming the non-doped dielectric layer, the additional structure stress of the silicon oxynitride layer can be reduced effectively. Thus, the above peeling and delamination can be prevent after performing the later steps. Besides, the annealing procedure can also be used to replace the required annealing step after forming the metal silicide layer, and to replace the thermal treatment after implanting the dopant into the substrate to form the source/drain areas. Therefore, the peeling and delamination issues due to the additional stress between the silicon oxynitride layer and the non-doped silicate glass can be resolved. And the frequency of the annealing procedure can also be reduced to just one time. Besides, the nitrogen atoms can penetrate into the interface between the non-doped silicate glass and the silicon oxynitride layer for forming the stronger bonding. Thus, the adhesion of the interface between the non-doped silicate glass, the silicon oxynitride layer and other layers can be promoted considerably.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A method for forming a MOSFET device on a semiconductor substrate, said method comprises:

defining a gate structure on said semiconductor substrate, wherein said gate structure is a multi-layer structure, and the upper layer of said gate structure is silicon oxynitride layer;

forming sidewall spacers on sidewalls of said gate structure;

forming doping areas in said semiconductor substrate adjacent to said gate structure to serve as the source/drain areas;

forming a non-doped silicate glass (NSG) on said semiconductor substrate to cover said gate structure, said sidewall spacers, and said doping areas; and performing an annealing procedure for said semiconductor substrate to reduce the additional structure stress between said silicon oxynitride layer and said NSG layer, and to promote the adhesion between said silicon oxynitride layer and said NSG layer.

2. The method according to claim 1, wherein said gate structure comprises of:

a gate oxide layer, formed on an upper surface of said semiconductor substrate;

a polysilicon layer, formed on said gate oxide layer; and a tungsten silicide layer, formed on said polysilicon layer, and said silicon oxynitride layer formed on said tungsten silicide layer.

3. The method according to claim 1, wherein said sidewall spacers are formed of silicon oxide.

4. The method according to claim 1, wherein said NSG layer has a thickness of about 1000 to 2500 angstroms.

5. The method according to claim 1, further comprising a step to form a borophosphosilicate glass (BPSG) layer on said NSG layer after performing said annealing procedure.

6. The method according to claim 1, wherein said silicon oxynitride layer is used to serve as an anti-reflection (ARC) layer.

7. The method according to claim 1, wherein said annealing procedure is performed about 10 to 15 minutes at a temperature of about 800 to 850° C.

8. The method according to claim 1, wherein a nitrogen gas with a flow rate about 5000 to 7000 sccm is used in performing said annealing procedure.

9. A method for forming a MOSFET device on a semiconductor substrate, said method comprises:

forming a gate oxide layer on said semiconductor substrate;

forming a polysilicon layer on said gate oxide layer;

forming a metal silicide layer on said polysilicon layer;

forming a silicon oxynitride layer on said metal silicide layer to serve as an anti-reflection (ARC) layer;

etching said silicon oxynitride layer, said metal silicide layer, said polysilicon layer, and said gate oxide layer to expose a portion of said semiconductor substrate for defining a gate structure on said semiconductor substrate;

forming sidewall spacers on sidewalls of said gate structure;

forming doping areas in said semiconductor substrate adjacent to said gate structure to serve as the source/drain areas;

forming a non-doped dielectric layer on said semiconductor substrate to cover said gate structure, said sidewall spacers, and said doping areas;

performing an annealing procedure for said semiconductor substrate about 10 to 15 minutes at a temperature of about 800 to 850° C.; and forming a dielectric layer on said non-doped dielectric layer.

10. The method according to claim 9, wherein said sidewall spacers are formed of silicon oxide.

11. The method according to claim 9, wherein said non-doped dielectric layer is a non-doped silicate glass (NSG) layer with a thickness of about 1000 to 2500 angstroms.

12. The method according to claim 9, wherein said dielectric layer is a borophosphosilicate glass (BPSG) layer with a thickness of about 4000 to 11000 angstroms.

13. The method according to claim 9, wherein a nitrogen gas with a flow rate of about 5000 to 7000 sccm is used in performing said annealing procedure.

14. The method according to claim 9, wherein said annealing procedure is used to reduce the additional structure stress between said silicon oxynitride layer and said non-doped dielectric layer.

15. The method according to claim 9, wherein said annealing procedure is used to promote the adhesion between said silicon oxynitride layer and said non-doped dielectric layer.

* * * * *